(12) United States Patent
Khlat

(10) Patent No.: US 11,929,720 B2
(45) Date of Patent: Mar. 12, 2024

(54) SYSTEMS AND METHODS FOR DELAY MEASUREMENT BETWEEN SIGNALS

(71) Applicant: Qorvo US, Inc, Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 422 days.

(21) Appl. No.: 17/308,249

(22) Filed: May 5, 2021

(65) Prior Publication Data

US 2022/0360237 A1   Nov. 10, 2022

(51) Int. Cl.
*H03F 3/04* (2006.01)
*H03F 1/02* (2006.01)
*H03F 3/195* (2006.01)
*H03F 3/24* (2006.01)

(52) U.S. Cl.
CPC ............. *H03F 3/24* (2013.01); *H03F 1/02* (2013.01); *H03F 3/195* (2013.01); *H03F 2200/102* (2013.01); *H03F 2200/451* (2013.01)

(58) Field of Classification Search
CPC ... H03F 3/24; H03F 1/02; H03F 3/195; H03F 2200/102; H03F 2200/451; H03F 3/245; H03F 1/0227; H03F 1/00; H03F 1/32; H03F 3/189; H03F 3/20; H03F 3/04; H03F 1/0244; H03F 1/0211; H03F 2200/504; H03G 3/3042; H03G 3/004
USPC .................................................. 330/127, 297
See application file for complete search history.

(56) References Cited

U.S. PATENT DOCUMENTS 10,868,499 B2 *  12/2020  Gorisse ................ H03F 1/0227

* cited by examiner

*Primary Examiner* — Khanh V Nguyen
(74) *Attorney, Agent, or Firm* — Withrow & Terranova, P.L.L.C.

(57) ABSTRACT

A difference between subsequent measures of a second signal when a first signal crosses a threshold value can be used to estimate a delay between the first and second signal. The delay can be used to compensate for delays between an envelope power supply signal and a radio frequency (RF) input signal.

20 Claims, 11 Drawing Sheets

SYSTEMS AND METHODS FOR DELAY MEASUREMENT BETWEEN SIGNALS

FIELD OF THE DISCLOSURE

The present disclosure is related to envelope tracking power supplies for radio frequency (RF) power amplifiers, and in particular to systems and methods for alignment of envelope tracking signals with RF input signals.

BACKGROUND

Envelope tracking power supplies for radio frequency (RF) power amplifiers enable increased performance and efficiency by providing a supply voltage that tracks a power envelope of an RF input signal. Often, an envelope tracking power supply voltage is delayed or advanced with respect to the RF input signal. This may cause the RF power amplifier to fail to meet linearity or error vector magnitude requirements. To synchronize an envelope tracking power supply voltage with an RF input signal, the delay between the signals must first be known. Accordingly, there is a need for improved envelope tracking power supply circuitry and in particular for delay estimation circuitry for envelope tracking power supply circuitry.

SUMMARY

In one embodiment, delay estimation circuitry includes programmable delay circuitry, comparator circuitry, sample and hold circuitry, difference calculation circuitry, and delay control circuitry. The programmable delay circuitry is configured to delay a first signal by an amount determined by a delay control signal. The comparator circuitry is coupled to the programmable delay circuitry and configured to detect when a magnitude of the first signal crosses a threshold value and provide a measurement indicator signal in response thereto. The sample and hold circuitry is coupled to the comparator circuitry and configured to sample and hold a magnitude of a second signal in response to the measurement indicator signal. The difference calculation circuitry is coupled to the sample and hold circuitry and configured to calculate a difference between subsequent measurements of the magnitude of the second signal and provide a difference signal based on the difference. The delay control circuitry is coupled to the difference calculation circuitry and the programmable delay circuitry and configured to calculate a delay between the first signal and the second signal based on changes in the difference signal over time and provide the delay control signal based on the changes in the delay. Calculating the delay based on a difference between subsequent measurements of the second signal when the first signal crosses the threshold value results in precise and fast determination of the delay, which can then be used in some embodiments to compensate for a delay between an envelope power supply signal and an RF input signal.

In one embodiment, the first signal and the second signal are monotonically related. The first signal may be a target envelope power supply voltage for an RF power amplifier or an envelope power supply voltage for the RF power amplifier. The second signal may be an estimated power supply current for the RF power amplifier or an output power of the RF power amplifier.

In one embodiment, the delay estimation circuitry further includes additional programmable delay circuitry, additional comparator circuitry, additional sample and hold circuitry, and additional difference calculation circuitry. The additional programmable delay circuitry is configured to delay the second signal by an amount determined by an additional delay control signal. The additional comparator circuitry is coupled to the additional programmable delay circuitry and configured to detect when a magnitude of the second signal crosses an additional threshold value and provide an additional measurement indicator signal in response thereto. The additional sample and hold circuitry is coupled to the additional comparator circuitry and configured to sample and hold a magnitude of the first signal in response to the additional measurement indicator signal. The additional difference calculation circuitry is configured to calculate a difference between subsequent measurements of the magnitude of the first signal and provide an additional difference signal based thereon. The delay control circuitry is further coupled to the additional difference calculation circuitry and the additional programmable delay circuitry and configured to calculate the delay between the first signal and the second signal based on changes in the difference signal and the additional difference signal over time and provide the additional delay control signal based on the delay.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
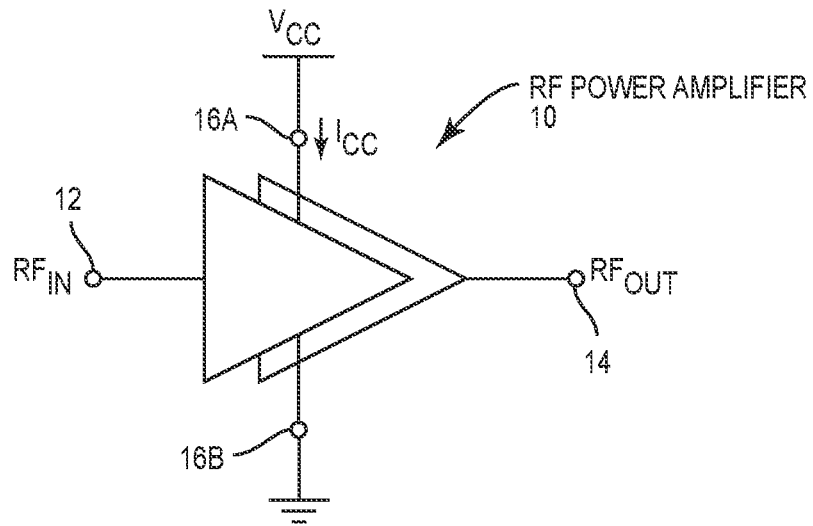
FIG. 1 is a schematic illustrating a radio frequency (RF) power amplifier according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 is a simplified schematic illustrating a radio frequency (RF) power amplifier 10 according to one embodiment of the present disclosure. The RF power amplifier 10 includes an input node 12, an output node 14, a first supply node 16A, and a second supply node 16B. The RF power amplifier 10 is configured to receive an RF input signal $RF_{in}$ at the input node 12 and amplify the RF input signal $RF_{in}$ using a supply voltage $V_{cc}$ at the first supply node 16A to provide an RF output signal $RF_{out}$. A supply current $I_{cc}$ flows across the RF power amplifier 10 during operation thereof. The second supply node 16B is coupled to ground. As discussed above, when the supply voltage $V_{cc}$ is provided such that it tracks a power envelope of the RF input signal $RF_{in}$, the linearity and efficiency of the RF power amplifier 10 will improve.

Figure 2:
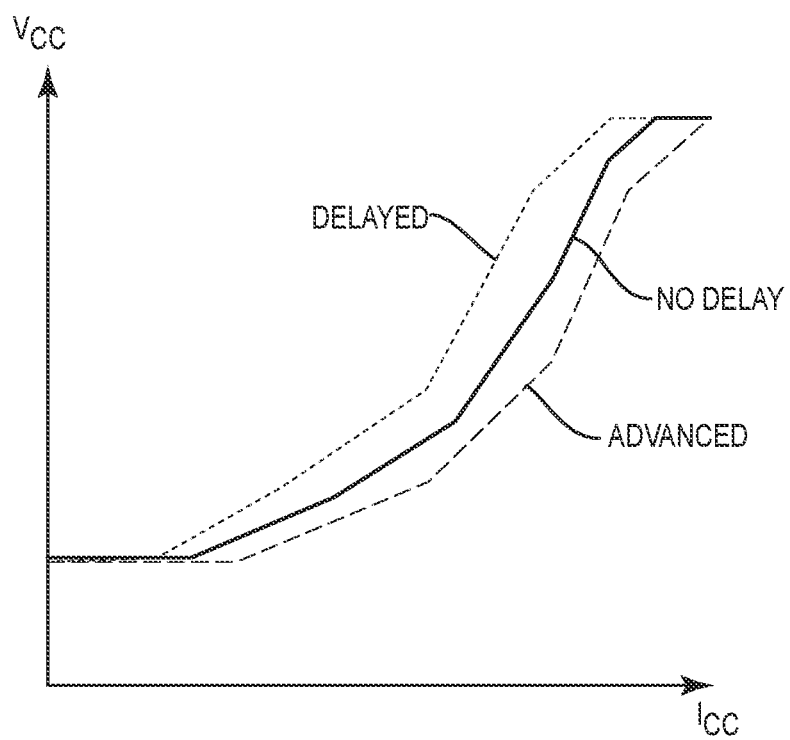
FIG. 2 is a graph illustrating a relationship between supply voltage and supply current for an RF power amplifier according to one embodiment of the present disclosure.

FIG. 2 is a graph illustrating a relationship between the supply voltage $V_{cc}$ and the supply current $I_{cc}$. As shown, the supply voltage $V_{cc}$ has a monotonic relationship with the supply current $I_{cc}$. The graph in FIG. 2 illustrates the relationship between the supply voltage $V_{cc}$ and the supply current $I_{cc}$ when the supply current $I_{cc}$ is advanced with respect to the supply voltage $V_{cc}$ (dashed line), when the supply current $I_{cc}$ is delayed with respect to the supply voltage $V_{cc}$ (dotted line), and when the supply current $I_{cc}$ is substantially synchronized with the supply voltage $V_{cc}$ (solid line). As will be discussed in detail below, the monotonic relationship between the supply voltage $V_{cc}$ and the supply current $I_{cc}$ can be used to determine a delay between these signals, which may be used to determine a delay of the supply voltage $V_{cc}$ with respect to the RF input signal $RF_{in}$ and therefore synchronize the supply voltage $V_{cc}$ with the RF input signal $RF_{in}$.

Figure 3A:
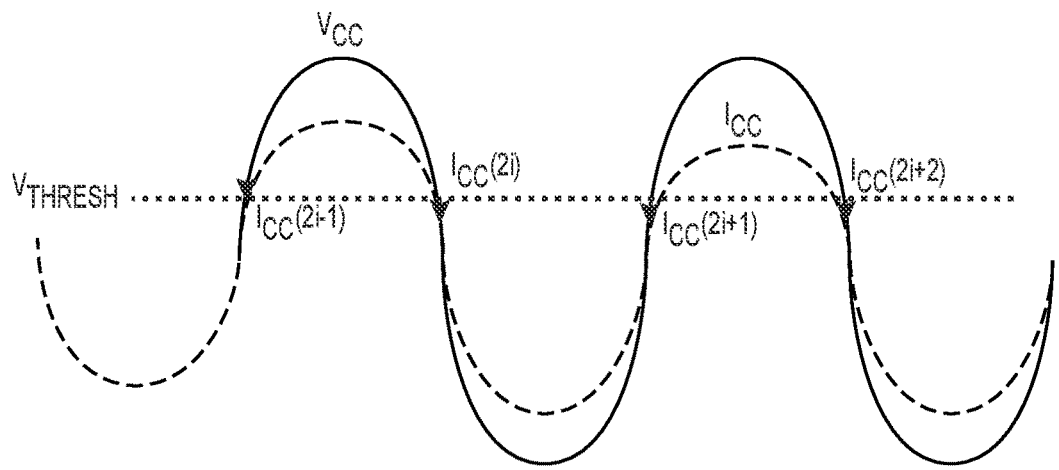
FIGS. 3A through 3C are graphs illustrating a relationship between supply voltage and supply current for an RF power amplifier according to one embodiment of the present disclosure.
Figure 3B:
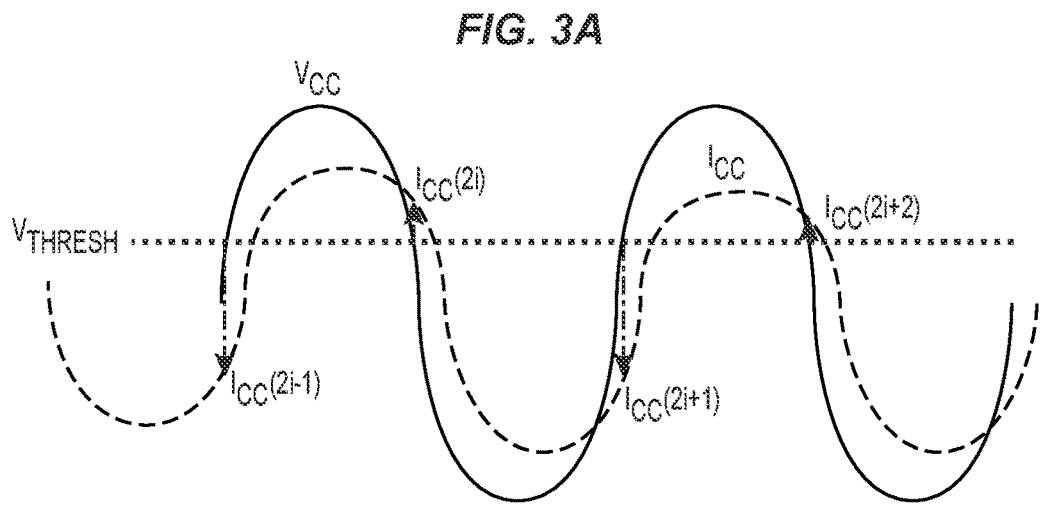
Figure 3C:
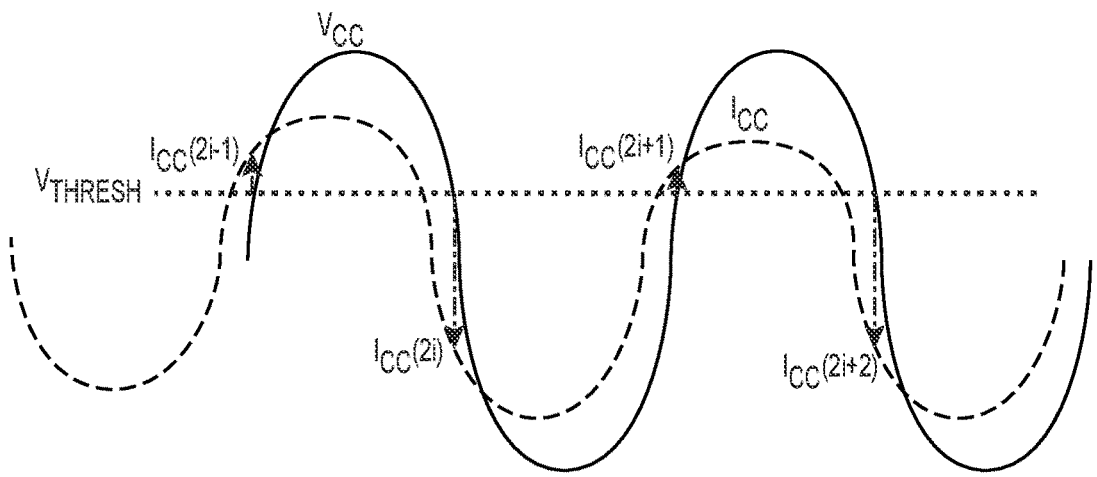

To further illustrate this point, FIGS. 3A through 3C illustrate the supply voltage $V_{cc}$ and the supply current $I_{cc}$ over time. For purposes of explanation, the supply voltage $V_{cc}$ and the supply current $I_{cc}$ are shown as sinusoidal signals having different magnitudes, however, those skilled in the art will readily appreciate that the supply voltage $V_{cc}$ and the supply current $I_{cc}$ will vary according to the power envelope of the RF input signal $RF_{in}$ and therefore provide an arbitrary waveform. FIG. 3A illustrates the supply voltage $V_{cc}$ and the supply current $I_{cc}$ when they are synchronized with one another. FIG. 3B illustrates the supply voltage $V_{cc}$ and the supply current $I_{cc}$ when the supply voltage $V_{cc}$ is delayed with respect to the supply current $I_{cc}$. FIG. 3C illustrates the supply voltage $V_{cc}$ and the supply current $I_{cc}$ when the supply voltage $V_{cc}$ is advanced with respect to the supply current $I_{cc}$. Each one of FIGS. 3A through 3C also shows a dashed line illustrating a threshold voltage $V_{thresh}$. A delay between the supply voltage $V_{cc}$ and the supply current $I_{cc}$ can be determined by taking a difference between magnitude values of the supply current $I_{cc}$ at subsequent crossings of the supply voltage $V_{cc}$ with the threshold voltage $V_{thresh}$.

For example, in FIG. 3A a difference between the magnitude of the supply current $I_{cc}$ at a first crossing of the supply voltage $V_{cc}$ and the threshold voltage $V_{thresh}$, shown as $I_{cc}(2i-1)$, and the magnitude of the supply current $I_{cc}$ at a second crossing of the supply voltage $V_{cc}$ and the threshold voltage $V_{thresh}$, shown as $I_{cc}(2i)$ is zero, indicating that the supply voltage $V_{cc}$ is synchronized with the supply current $I_{cc}$. In FIG. 3B, a difference between the magnitude of the supply current $I_{cc}$ at a first crossing of the supply voltage $V_{cc}$ and the threshold voltage $V_{thresh}$, shown as $I_{cc}(2i-1)$, and the magnitude of the supply current $I_{cc}$ at a second crossing of the supply voltage $V_{cc}$ and the threshold voltage $V_{thresh}$, shown as $I_{cc}(2i)$ is some positive value, indicating that the supply voltage $V_{cc}$ is delayed with respect to the supply current $I_{cc}$. In FIG. 3C, a difference between the magnitude of the supply current $I_{cc}$ at a first crossing of the supply voltage $V_{cc}$ and the threshold voltage $V_{thresh}$, shown as $I_{cc}(2i-1)$, and the magnitude of the supply current $I_{cc}$ at a second crossing of the supply voltage $V_{cc}$ and the threshold voltage $V_{thresh}$, shown as $I_{cc}(2i)$ is some negative value, indicating that the supply voltage $V_{cc}$ is advanced with respect to the supply current $I_{cc}$. Measurements of the magnitude of the supply current $I_{cc}$ can be taken at each pair of subsequent crossings of the supply voltage $V_{cc}$ and the threshold voltage $V_{thresh}$ and compared to determine a delay between the supply voltage $V_{cc}$ and the supply current $I_{cc}$ and observe how this delay changes over time. The magnitude of the difference between the supply current values $I_{cc}$ at subsequent crossings of the supply voltage $V_{cc}$ and the threshold voltage $V_{thresh}$ is indicative of the magnitude of the delay between the supply voltage $V_{cc}$ and the supply current $I_{cc}$.

In addition to measuring and comparing the magnitude of the supply current $I_{cc}$ at subsequent crossings of the supply voltage $V_{cc}$ and the threshold voltage $V_{thresh}$ to determine a delay between the signals, the opposite can also be done either independently or simultaneously. That is, the magnitude of the supply voltage $V_{cc}$ can be measured and compared at subsequent crossings of the supply current $I_{cc}$ and a threshold current $I_{thresh}$ to determine the delay between the signals. When done simultaneously, these measurements can improve the accuracy of the delay measurement between the signals.

Figure 4A:
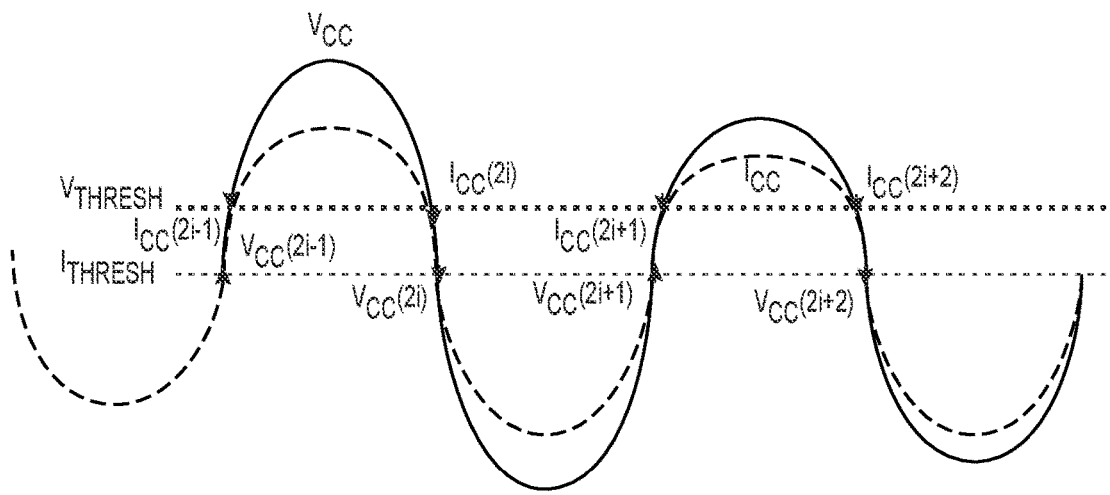
FIGS. 4A through 4C are graphs illustrating a relationship between supply voltage and supply current for an RF power amplifier according to one embodiment of the present disclosure.
Figure 4B:
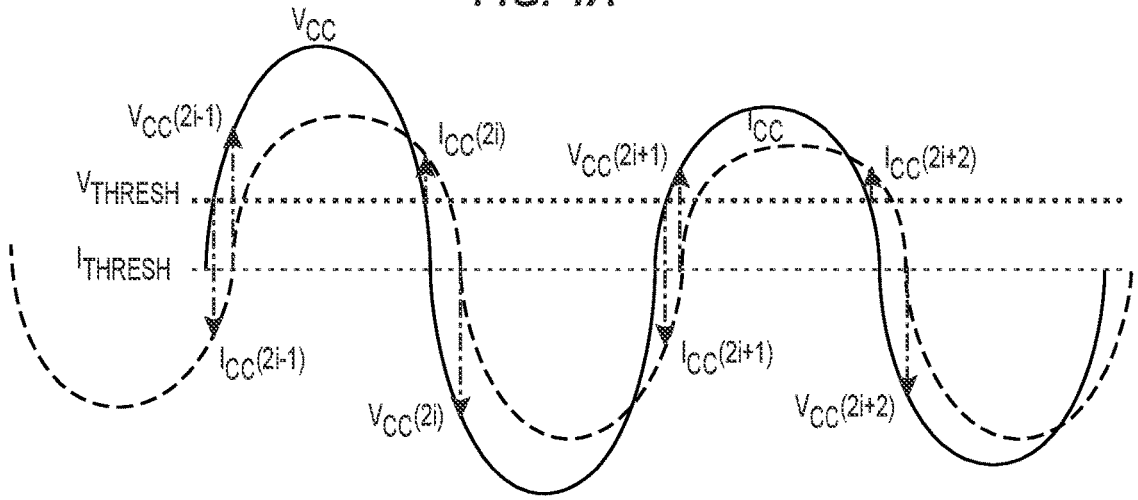
Figure 4C:
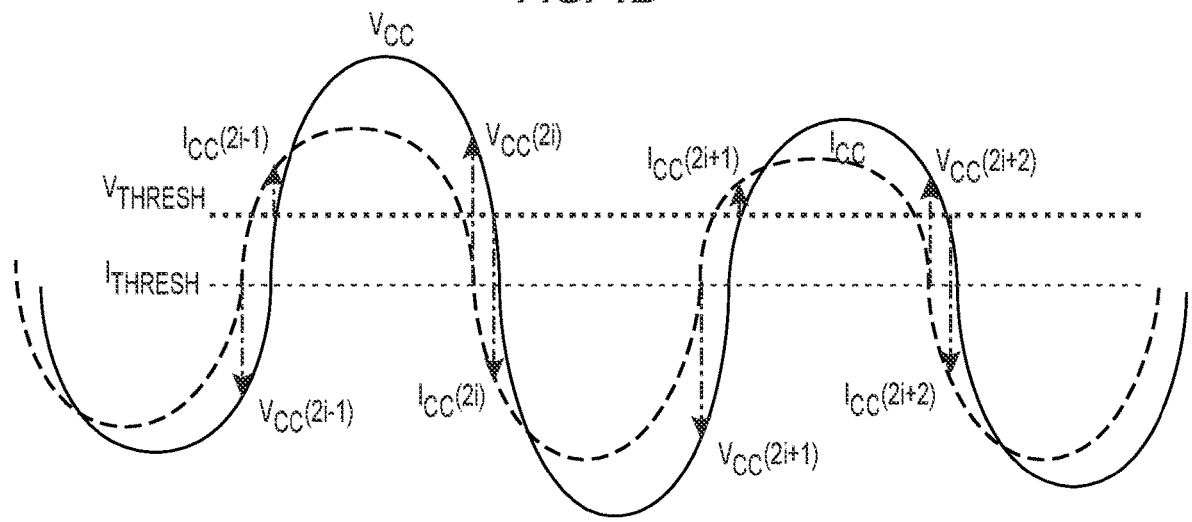

Accordingly, FIGS. 4A through 4C illustrate the supply voltage $V_{cc}$ and the supply current $I_{cc}$ over time. FIG. 4A illustrates the supply voltage $V_{cc}$ and the supply current $I_{cc}$ when they are synchronized with one another. FIG. 4B illustrates the supply voltage $V_{cc}$ and the supply current $I_{cc}$ when the supply voltage $V_{cc}$ is delayed with respect to the supply current $I_{cc}$. FIG. 4C illustrates the supply voltage $V_{cc}$ and the supply current $I_{cc}$ when the supply voltage $V_{cc}$ is advanced with respect to the supply current $I_{cc}$. Each one of FIGS. 4A through 4C also shows a first dashed line illustrating a threshold voltage $V_{thresh}$ and a second dashed line illustrating a threshold current $I_{thresh}$. The difference between magnitude values of the supply current $I_{cc}$ can be measured and compared at subsequent crossings of the supply voltage $V_{cc}$ and the threshold voltage $V_{thresh}$ as discussed above. Independently or simultaneously, magnitude values of the supply voltage $V_{cc}$ can be measured and compared at subsequent crossings of the supply current $I_{cc}$ and the threshold current $I_{thresh}$.

For example, in FIG. 4A a difference between the magnitude of the supply voltage $V_{cc}$ at a first crossing of the supply current $I_{cc}$ and the threshold current $I_{thresh}$, shown as $V_{cc}(2i-1)$ and the magnitude of the supply voltage $V_{cc}$ at a second crossing of the supply current $I_{cc}$ and the threshold current $I_{thresh}$, shown as $V_{cc}(2i)$ is zero, indicating that the supply voltage $V_{cc}$ is synchronized with the supply current $I_{cc}$. In FIG. 4B, a difference between the magnitude of the supply voltage $V_{cc}$ at a first crossing of the supply current $I_{cc}$ and the threshold current $I_{thresh}$, shown as $V_{cc}(2i-1)$ and the magnitude of the supply voltage $V_{cc}$ at a second crossing of the supply current $I_{cc}$ and the threshold current $I_{thresh}$, shown as $V_{cc}(2i)$ is negative, indicating that the supply current $I_{cc}$ is advanced with respect to the supply voltage $V_{cc}$. In FIG. 4C, a difference between the magnitude of the supply voltage $V_{cc}$ at a first crossing of the supply current $I_{cc}$ and the threshold current $I_{thresh}$, shown as $V_{cc}(2i-1)$ and the magnitude of the supply voltage $V_{cc}$ at a second crossing of the supply current $I_{cc}$ and the threshold current $I_{thresh}$, shown as $V_{cc}(2i)$ is positive, indicating that the supply current $I_{cc}$ is delayed with respect to the supply voltage $V_{cc}$. The magnitude of the difference between the supply voltage $V_{cc}$ at subsequent crossings of the supply current $I_{cc}$ and the threshold current $I_{thresh}$ is indicative of the magnitude of the delay between the supply voltage $V_{cc}$ and the supply current $I_{cc}$.

Notably, the supply voltage $V_{cc}$ and the supply current $I_{cc}$ are only two examples of signals between which a delay can be measured using the principles discussed herein. In general, the principles described herein can be used to measure a delay between any two signals that are monotonically related. In one embodiment, the principles discussed herein are used to measure a delay between the supply voltage $V_{cc}$ and an output power $P_{out}$ of the RF power amplifier 10. Further, one or more of the signals between which a delay is measured may be an estimated signal. In such a case, the estimated signal may be based on the signal it is being measured against. For example, the supply voltage $V_{cc}$ as measured or estimated may be used to estimate the supply current $I_{cc}$ based on some relationship between the two, and the delay between these signals can then be measured.

Figure 5:
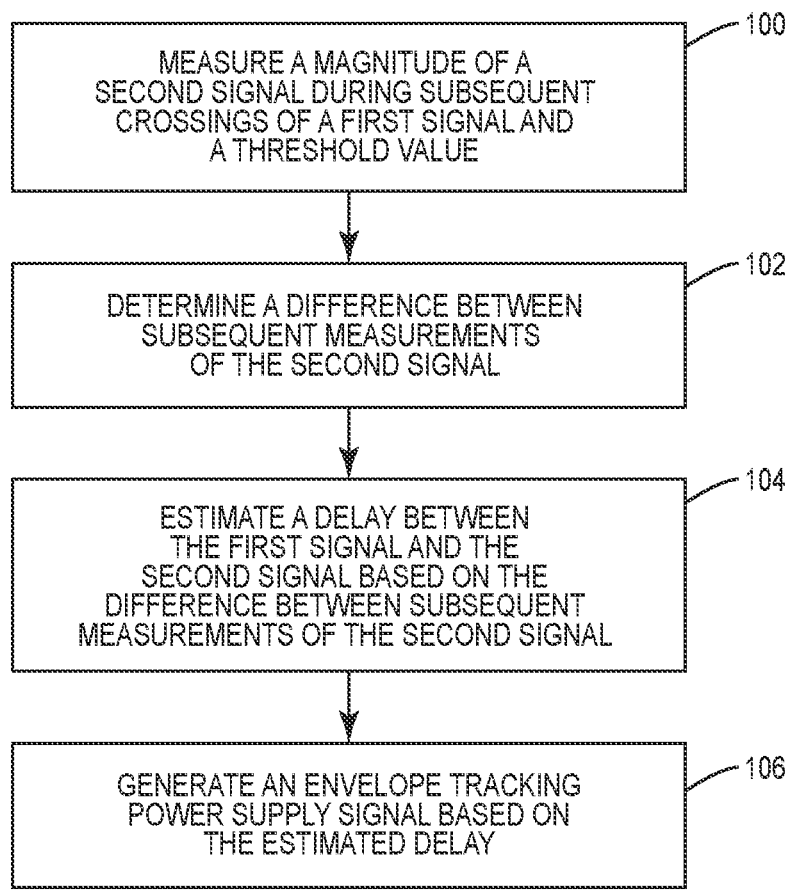
FIG. 5 is a flow diagram illustrating a method for estimating a delay between signals according to one embodiment of the present disclosure.

FIG. 5 is a flow diagram illustrating a method for measuring the delay between two signals and, optionally, using the measured delay to generate an envelope tracking power supply signal according to one embodiment of the present disclosure. First, a magnitude of a second signal is measured during subsequent crossings of a first signal and a threshold value (step 100). A difference is determined between subsequent measurements of the second signal (step 102). A delay between the first signal and the second signal is then estimated based on the difference between the subsequent measurements of the second signal (step 104). The delay between the first signal and the second signal may be related in any way to the difference between subsequent measurements of the second signal. The delay between the first signal and the second signal may be determined according to the relationship between the delay and the difference. An envelope tracking power supply signal is then generated based on the estimated delay between the first signal and the second signal (step 106). As discussed above, the estimated delay may be used to delay or advance the envelope tracking power supply signal so that it is synchronized with the RF input signal $RF_{in}$.

Figure 6:
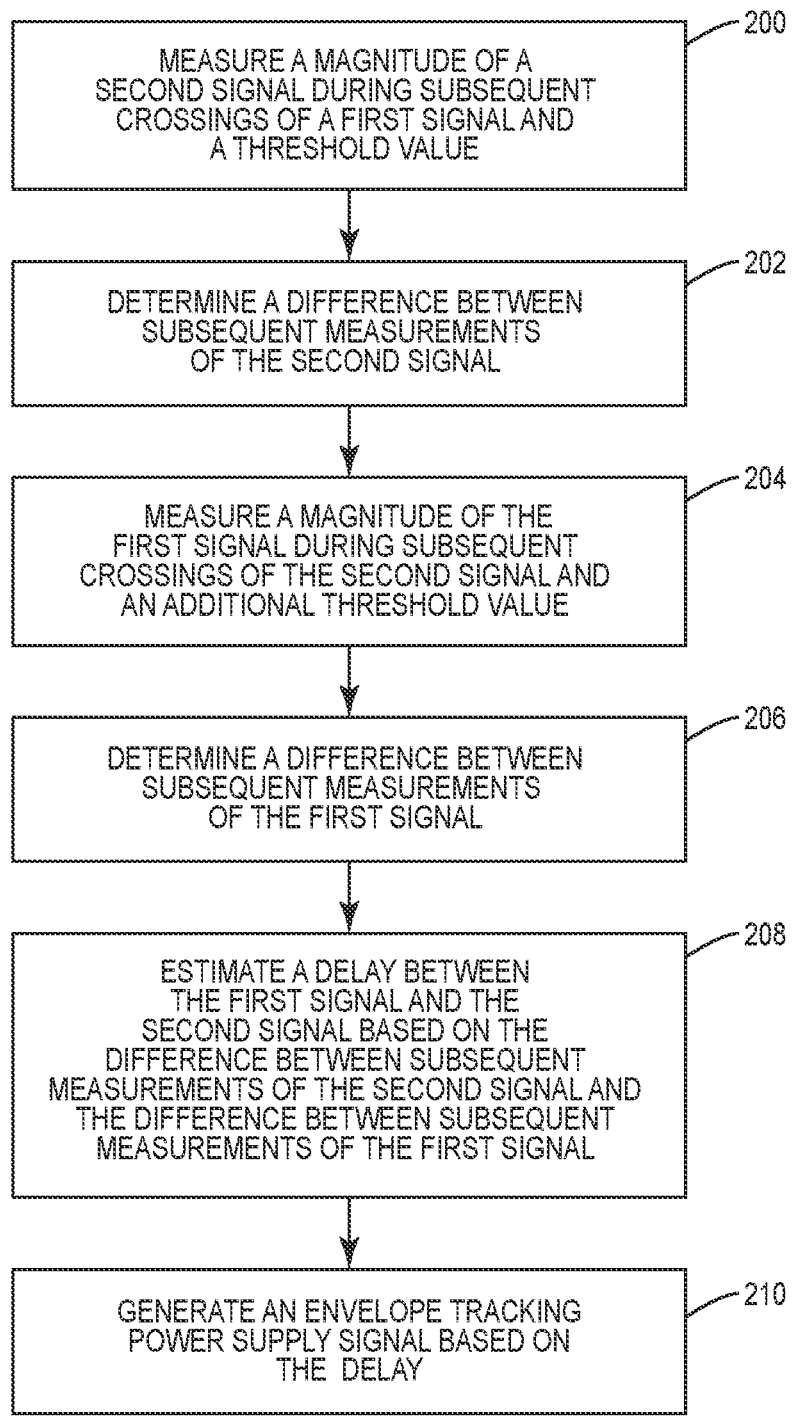
FIG. 6 is a flow diagram illustrating a method for estimating a delay between signals according to one embodiment of the present disclosure.

FIG. 6 is a flow diagram illustrating a method for measuring the delay between two signals and, optionally, using the measured delay to generate an envelope tracking power supply signal according to an additional embodiment of the present disclosure. First, a magnitude of a second signal is measured during subsequent crossings of a first signal and a threshold value (step 200). A difference is determined between subsequent measurements of the second signal (step 202). A magnitude of the first signal is measured during subsequent crossings of the second signal and an additional threshold value (step 204). A difference is determined between subsequent measurements of the first signal (step 206). A delay between the first signal and the second signal is then estimated based on the difference between subsequent measurements of the second signal and the difference between subsequent measurements of the first signal (step 208). The delay between the first signal and the second signal may be related in any way to the difference between subsequent measurements of the second signal. The delay between the first signal and the second signal may be determined according to the relationship between the delay and the difference. An envelope tracking power supply signal is then generated based on the estimated delay between the first signal and the second signal (step 210). As discussed above, the estimated delay may be used to delay or advance the envelope tracking power supply signal so that it is synchronized with the RF input signal $RF_{in}$.

Figure 7:
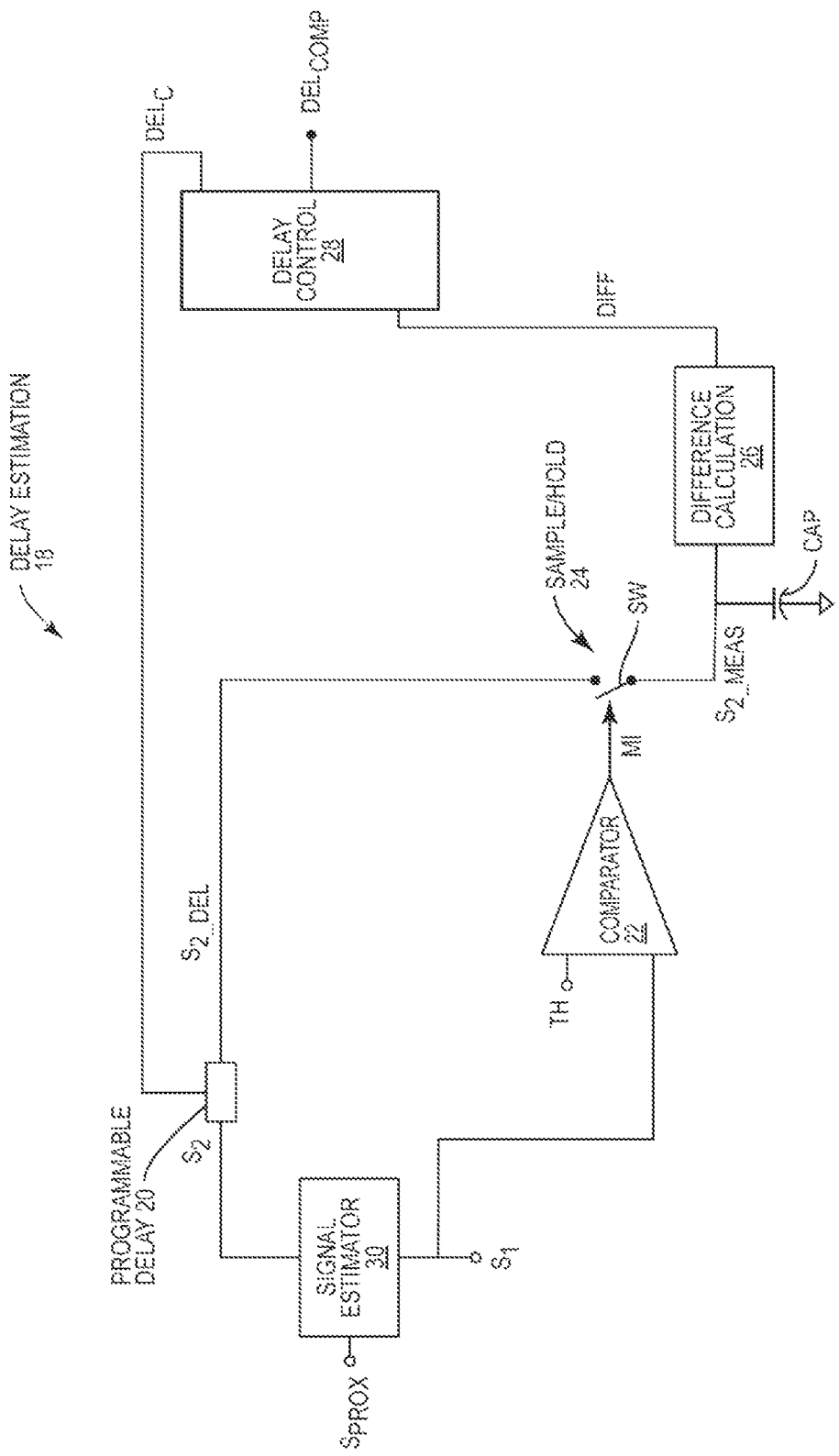
FIG. 7 is a schematic illustrating delay estimation circuitry according to one embodiment of the present disclosure.

In general, the present disclosure contemplates the use of any circuitry for measuring the delay between monotonically related signals as discussed above. An example of delay estimation circuitry 18 is shown in FIG. 7. The delay estimation circuitry 18 includes programmable delay circuitry 20, comparator circuitry 22, sample and hold circuitry 24, difference calculation circuitry 26, and delay control circuitry 28. The programmable delay circuitry 20 is coupled between an input and the sample and hold circuitry 24. The comparator circuitry 22 is coupled between an input and the sample and hold circuitry 24. The difference calculation circuitry 26 is coupled between the sample and hold circuitry 24 and the delay control circuitry 28. The delay control circuitry is coupled between the difference calculation circuitry 26 and the programmable delay circuitry 20, forming a feedback loop. The delay control circuitry 28 is also coupled to an output.

In operation, a first signal $S_1$ is provided to the comparator circuitry 22. A second signal $S_2$ is provided to the programmable delay circuitry 20. The second signal $S_2$ may be directly provided to the programmable delay circuitry 20, or may be an estimated signal generated by signal estimation circuitry 30 based on the first signal $S_1$ and one or more proxy signals $S_{prox}$ related to the second signal $S_2$. The programmable delay circuitry is configured to delay the second signal $S_2$ by an amount determined by a delay control signal $DEL_c$, which is provided by the delay control circuitry 28 as discussed below. The first signal $S_1$ is provided to the comparator circuitry 22 along with a threshold value TH. When the first signal $S_1$ crosses the threshold value TH, the comparator circuitry 22 provides a measurement indicator signal MI, which momentarily activates a switch SW in the sample and hold circuitry 24 to store a measured second signal $S_{2\_meas}$ in a capacitor CAP. Notably, the measured second signal $S_{2\_meas}$ is based on the delayed second signal $S_{2\_del}$. The difference calculation circuitry 26 calculates a difference between the measured second signal $S_{2\_meas}$ and a previously measured second signal $S_2$, providing a difference signal DIFF that is indicative of this value. In some embodiments, the difference signal DIFF is equal to the difference between the subsequent measurements of the second signal $S_2$. The delay control circuitry 28 receives the difference signal DIFF and provides the delay control signal $DEL_c$ based on changes in the difference signal DIFF over time (e.g., an average of the difference signal over time). As discussed above, the delay control signal $DEL_c$ controls the amount the second signal $S_2$ is delayed before delivery to the sample and hold circuitry 24. The delay control circuitry 28 adjusts the delay control signal $DEL_c$ iteratively to minimize the difference between subsequent measurements of the second signal $S_2$ and thus the magnitude of the difference signal DIFF. The delay control circuitry 28 may estimate the delay between the first signal $S_1$ and the second signal $S_2$ based on the delay control signal $DEL_c$ that minimizes the difference signal DIFF. The delay control signal $DEL_c$ may provide a signal indicative of the estimated delay as a delay compensation control signal $DEL_{comp}$, which as discussed below may be used to align an envelope power supply signal with an RF input signal.

Figure 8:
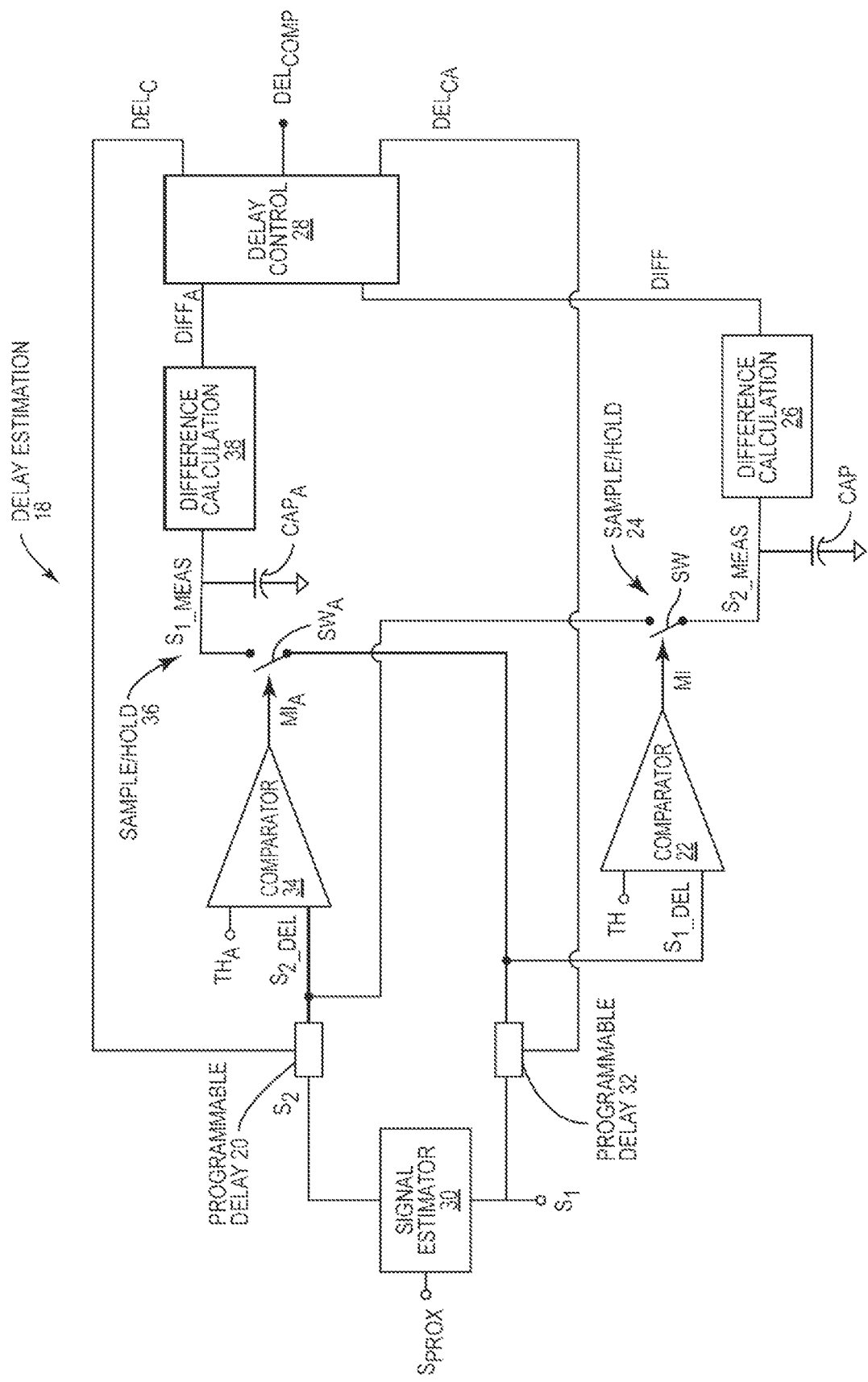
FIG. 8 is a schematic illustrating envelope tracking power supply circuitry for an RF power amplifier according to one embodiment of the present disclosure.

Notably, the delay estimation circuitry 18 in FIG. 7 only works when the first signal $S_1$ is delayed with respect to the second signal $S_2$, since the second signal $S_2$ is the one being delayed. To cover situations wherein the first signal $S_1$ is advanced with respect to the second signal $S_2$ the first signal $S_1$ and the second signal $S_2$ could be exchanged in the delay estimation circuitry 18. However, it may be desirable for the delay estimation circuitry 18 to be capable of handling any delay relationship between the first signal $S_1$ and the second signal $S_2$, in which case the delay estimation circuitry 18 may include additional programmable delay circuitry 32, additional comparator circuitry 34, additional sample and hold circuitry 36, and additional difference calculation circuitry 38 as shown in FIG. 8.

The programmable delay circuitry 20 is coupled between an input and the sample and hold circuitry 24 as discussed above, but also between the input and the additional comparator circuitry 34. The additional programmable delay circuitry 32 is coupled between an input and the additional sample and hold circuitry 36, as well as between the input and the comparator 22, such that the comparator 22 is coupled between the additional programmable delay circuitry 32 and the sample and hold circuitry 24. The additional comparator circuitry 34 is coupled between the programmable delay circuitry 20 and the additional sample and hold circuitry 36. The additional sample and hold circuitry 36 is coupled between the additional comparator circuitry 34 and the additional difference calculation circuitry 38. The additional difference calculation circuitry 38 is coupled between the additional sample and hold circuitry 36 and the delay control circuitry 28.

In operation, the programmable delay circuitry 20, the comparator circuitry 22, the sample and hold circuitry 24, the difference calculation circuitry 26, and the delay control circuitry 28 can operate in a substantially similar way as described above. The additional programmable delay circuitry 32 is configured to delay the first signal $S_1$ by an amount determined by an additional delay control signal $DEL_{ca}$, which is provided by the delay control circuitry 28 as discussed below. Since the additional programmable delay circuitry 32 is coupled to the comparator 22, the comparator 22 performs the same function discussed above using a delayed version of the first signal $S_{1\_del}$ instead of the first signal $S_1$. The additional comparator circuitry 34 receives the delayed second signal $S_{2\_del}$ and an additional threshold value $TH_a$. When the delayed second signal $S_{2\_del}$ crosses the additional threshold value $TH_a$, the additional comparator circuitry 34 provides an additional measurement indicator signal $MI_a$, which momentarily activates an additional switch $SW_a$ in the additional sample and hold circuitry 36 to store a measured first signal $S_{1\_meas}$ in an additional capacitor $CAP_a$. Notably, the measured first signal $S_{1\_meas}$ is based on the delayed first signal $S_{1\_del}$. The additional difference calculation circuitry 38 calculates a difference between the measured first signal $S_{1\_meas}$ and a previously measured first signal $S_1$, providing an additional difference signal $DIFF_a$ that is indicative of this value. In some embodiments, the additional difference signal $DIFF_a$ is equal to the difference between the subsequent measurements of the first signal $S_1$. The delay control circuitry 28 receives the difference signal DIFF and the additional difference signal $DIFF_a$. Depending on whether the first signal $S_1$ is delayed with respect to the second signal $S_2$ or vice versa, the delay control circuitry 28 provides the delay control signal $DEL_c$ and the additional delay control signal $DEL_{ca}$ to delay one of the first signal $S_1$ and the second signal $S_2$. Notably, only one of the first signal $S_1$ and the second signal $S_2$ are delayed at a given time. For example, if the first signal $S_1$ is advanced with respect to the second signal $S_2$, the delay control circuitry 28 provides the delay control signal $DEL_c$ to cause the programmable delay circuitry 20 to delay the second signal $S_2$ and provides the additional delay control signal $DEL_{ca}$ to cause the additional programmable delay circuitry 32 not to delay the first signal $S_1$. In the opposite scenario in which the first signal $S_1$ is delayed with respect to the second signal $S_2$, the delay control circuitry 28 provides the delay control signal $DEL_c$ to cause the programmable delay circuitry 20 not to delay the second signal $S_2$ and provides the additional delay control signal $DEL_{ca}$ to cause the additional programmable delay circuitry 32 to delay the first signal $S_1$. As discussed above, by iteratively adjusting the delay control signal $DEL_c$ and the additional delay control signal $DEL_{ca}$ to minimize the difference signal DIFF and the additional difference signal $DIFF_a$, the delay control circuitry 28 can estimate a delay between the first signal $S_1$ and the second signal $S_2$, which may be indicated by the delay compensation control signal $DEL_{comp}$.

As discussed above, the first signal $S_1$ may be a measured, estimated, or target envelope power supply voltage $V_{cc}$ as discussed above with respect to FIG. 1. The second signal $S_2$ may be a measured, estimated, or target envelope power supply current $I_{cc}$ as discussed above with respect to FIG. 1. Further, the second signal $S_2$ may be a measured, estimated, or target output power of an RF power amplifier. In various embodiments, the first signal $S_1$ and the second signal $S_2$ may be swapped.

The delay compensation control signal $DEL_{comp}$ may be directly proportional to the estimated delay between the first signal $S_1$ and the second signal $S_2$ or may be related to the estimated delay between the first signal $S_1$ and the second signal $S_2$ by any relationship.

Figure 9:
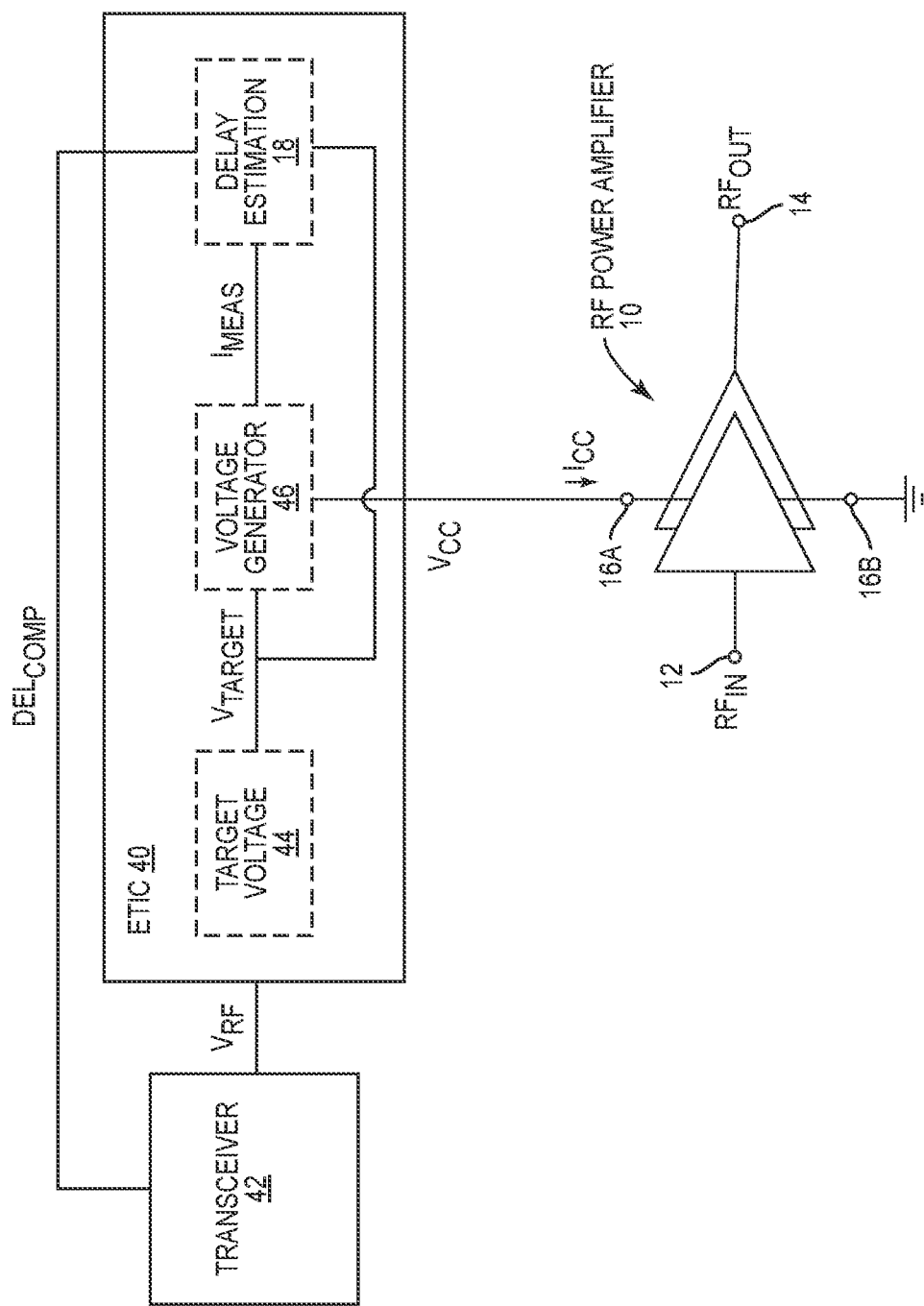
FIG. 9 is a schematic illustrating envelope tracking power supply circuitry for an RF power amplifier according to one embodiment of the present disclosure.

The delay estimation circuitry 18 may be used in a variety of ways to align an envelope power supply signal with an RF input signal. FIG. 9 thus shows the RF power amplifier 10 along with an envelope tracking integrated circuit 40 and transceiver circuitry 42. The envelope tracking integrated circuit 40 includes target voltage circuitry 44 and voltage generator circuitry 46. In operation, the transceiver circuitry 42 provides a signal $V_{RF}$ indicative of the RF input signal $RF_{in}$ to the envelope tracking integrated circuit 40. This signal $V_{RF}$ may be the RF input signal $RF_{in}$ itself or an analogue thereof such as a differential ramp voltage based on the RF input signal $RF_{in}$. The target voltage circuitry 44 in the envelope tracking integrated circuit 40 determines a target voltage $V_{target}$ for the power supply voltage $V_{cc}$ based on the power envelope of the RF input signal $RF_{in}$, and provides this target voltage $V_{target}$ to the voltage generator circuitry 46 and the delay estimation circuitry 18. The voltage generator circuitry 46 generates the power supply voltage $V_{cc}$ based on the target voltage $V_{target}$ (attempting to meet the voltage) and provides it to the RF power amplifier 10. The delay estimation circuitry 18 operates as described above using the target voltage $V_{target}$ and, in some embodiments, a measured current $I_{meas}$ from the voltage generator circuitry 46 that is proportional to the power supply current $I_{cc}$ (e.g., from a parallel amplifier in the voltage generator circuitry 46 where the measured current $I_{meas}$ is offset by some capacitance associated with the RF power amplifier 10) to estimate a delay between the target voltage $V_{target}$ and an estimate of the power supply current $I_{cc}$ (generated by the signal estimation circuitry 30 based on a known relationship between the target voltage $V_{target}$, the measured current $I_{meas}$, and the power supply current $I_{cc}$). The delay estimation circuitry 18 provides the delay compensation control signal $DEL_{comp}$ to the transceiver circuitry 42, where it may be used to align the RF input signal $RF_{in}$ and the power supply voltage $V_{cc}$ as it tracks the envelope of the RF input signal $RF_{in}$, for example, by altering the signal $V_{RF}$ indicative of the RF input signal $RF_{in}$ provided to the envelope tracking integrated circuit 40. In one embodiment, the delay compensation control signal $DEL_{comp}$ is provided to the transceiver circuitry 42 via a radio frequency front end (RFFE) communications bus. However, the delay estimation circuitry 18 may communicate with the transceiver circuitry 42 in any suitable manner.

Figure 10:
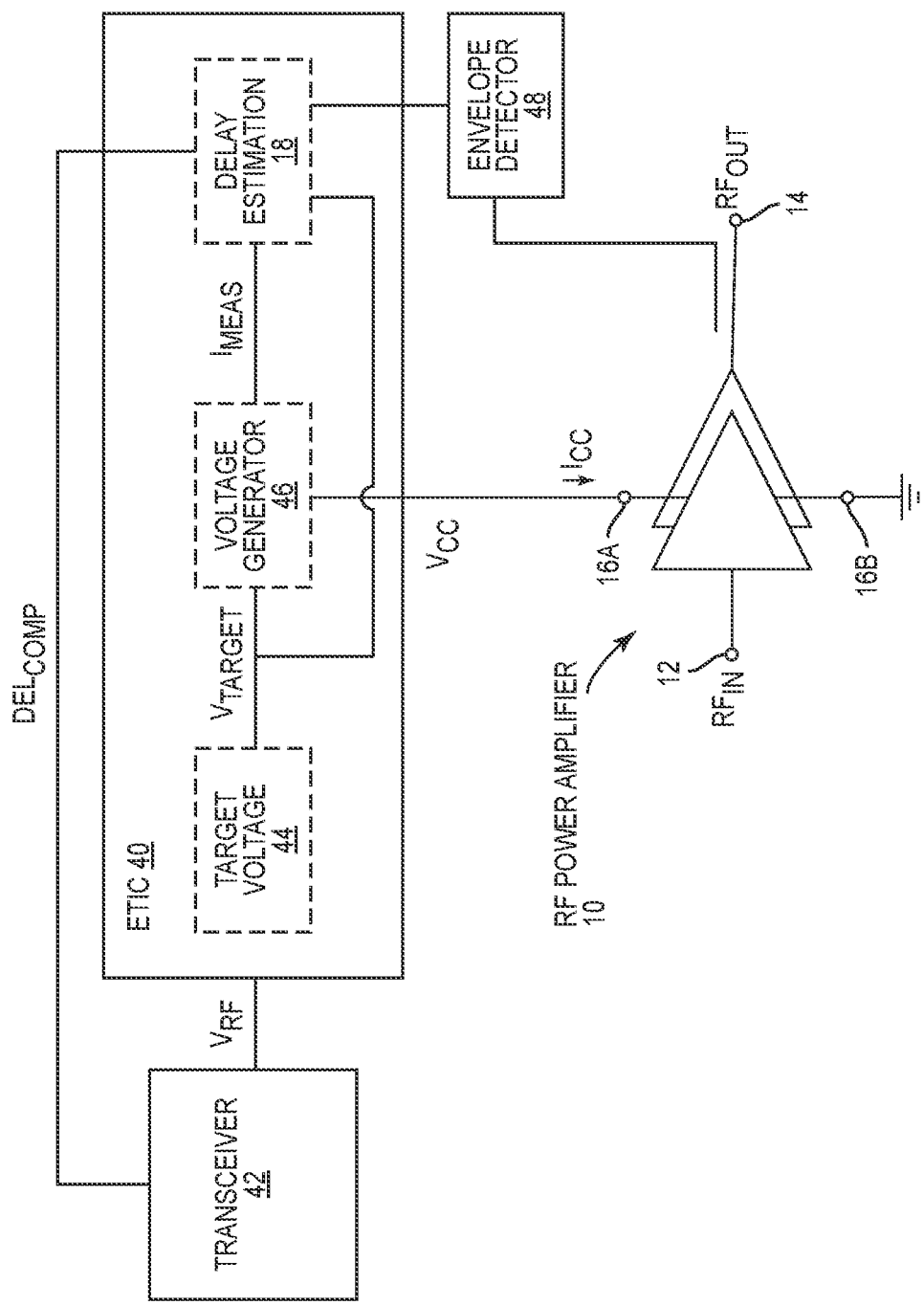
FIG. 10 is a schematic illustrating envelope tracking power supply circuitry for an RF power amplifier according to one embodiment of the present disclosure.

FIG. 10 shows the RF power amplifier 10 and supporting circuitry according to an additional embodiment of the present disclosure. FIG. 10 is substantially similar to FIG. 9, except for the addition of an envelope detector 48, which is coupled between an output of the RF power amplifier 10 and the delay estimation circuitry 18. As discussed above, the principles described herein can be used to detect a delay between any two monotonically related signals. In this case, the delay estimation circuitry 18 estimates a delay between the target voltage $V_{target}$ and an output power $P_{out}$ of the RF power amplifier 10 to determine the delay compensation control signal $DEL_{comp}$. The delay compensation control signal $DEL_{comp}$ is communicated to the transceiver circuitry 42 as discussed above in order to align the RF input signal $RF_{in}$ and the power supply voltage $V_{cc}$ as it tracks the power envelope of the RF input signal $RF_{in}$.

Figure 11:
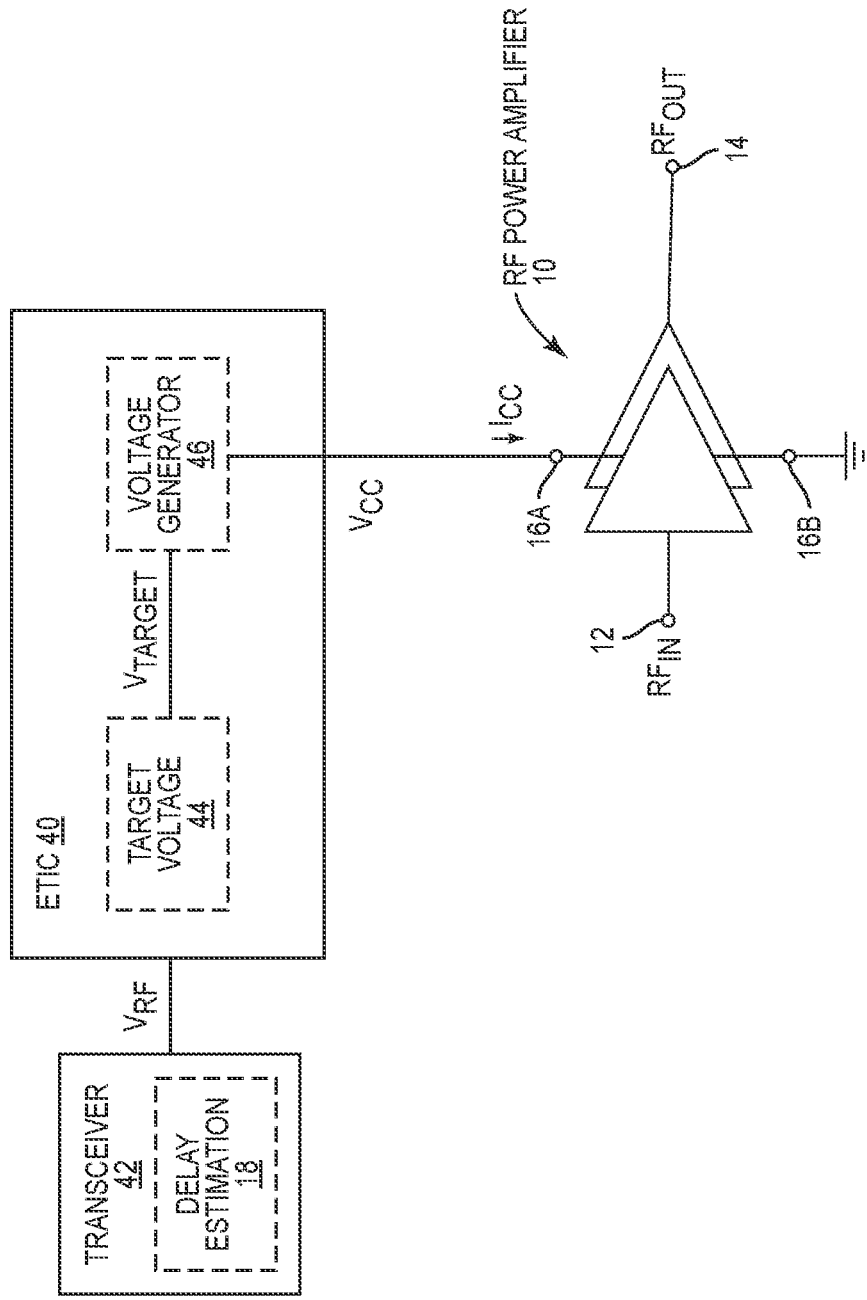
FIG. 11 is a schematic illustrating envelope tracking power supply circuitry for an RF power amplifier according to one embodiment of the present disclosure.

FIG. 11 shows the RF power amplifier 10 and supporting circuitry according to an additional embodiment of the present disclosure. FIG. 11 is substantially similar to FIG. 9, except that the delay estimation circuitry 18 is located in the transceiver circuitry 42 rather than the envelope tracking integrated circuit 40. The delay estimation circuitry 18 may operate in the same manner as described above, using a target voltage $V_{target}$ generated within the transceiver circuitry 42 or otherwise communicated to the transceiver circuitry 42 along with one or more other signals to estimate a delay and generate the delay compensation control signal $DEL_{comp}$.

Figure 12:
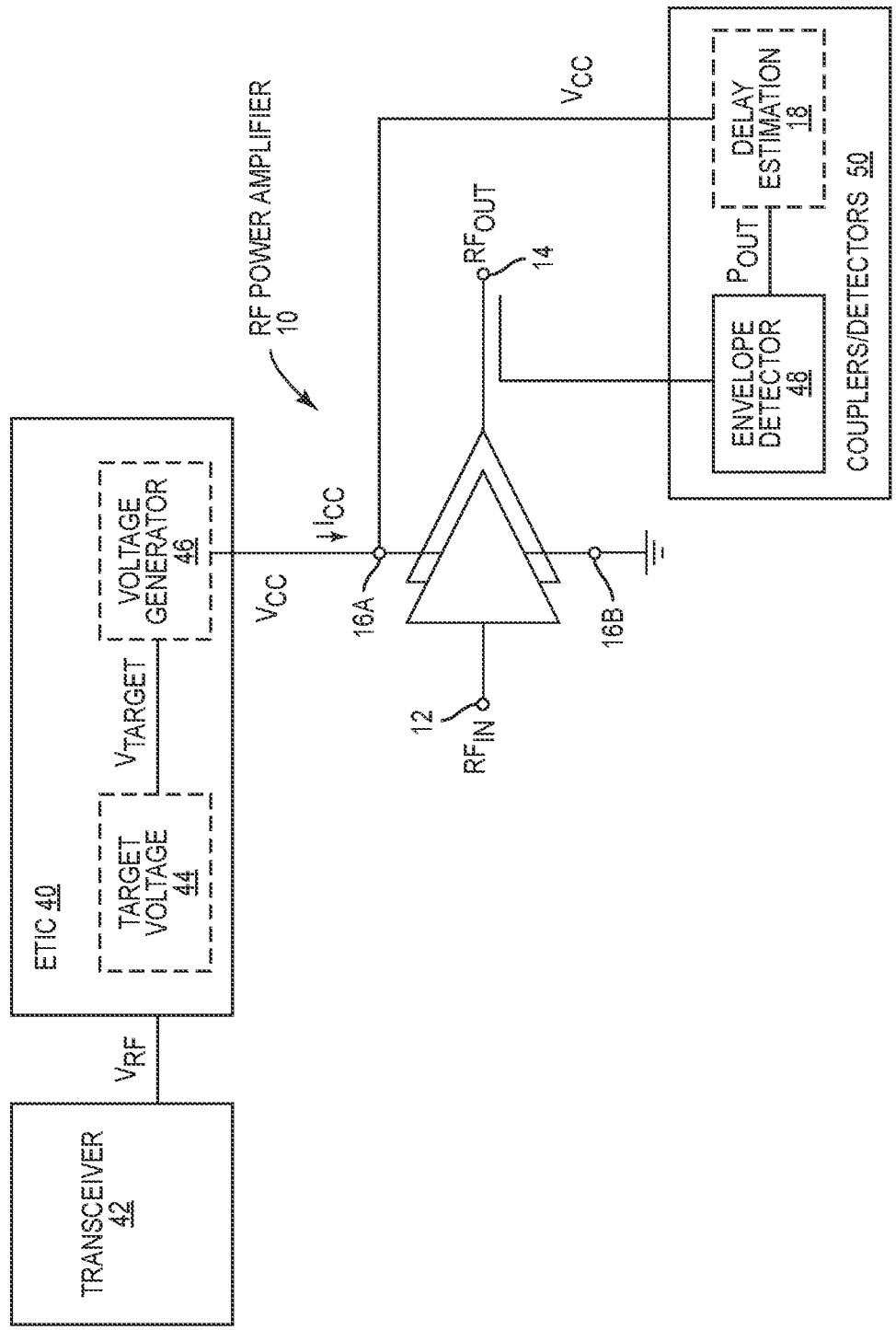
FIG. 12 is a schematic illustrating envelope tracking power supply circuitry for an RF power amplifier according to one embodiment of the present disclosure.

FIG. 12 shows the RF power amplifier 10 and supporting circuitry according to an additional embodiment of the present disclosure. FIG. 12 is substantially similar to FIG. 9, except that the delay estimation circuitry 18 is integrated as part of a group of coupler/detector circuitry 50, which is coupled to the output of the RF power amplifier 10 as shown. The delay estimation circuitry 18 may operate in the same manner as described above, using a measured power supply voltage $V_{cc}$ and output power $P_{out}$ to estimate a delay and generate the delay compensation control signal $DEL_{comp}$, which may be communicated to the envelope tracking integrated circuit 40, the transceiver circuitry 42, or any other circuitry where it is used to align the RF input signal $RF_{in}$ and the power supply voltage $V_{cc}$ as it tracks the power envelope of the RF input signal $RF_{in}$.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. Delay estimation circuitry comprising:
    programmable delay circuitry configured to delay a first signal by an amount determined by a delay control signal;
    comparator circuitry coupled to the programmable delay circuitry and configured to:
        detect when a magnitude of the first signal from the programmable delay circuitry crosses a threshold value; and
        provide a measurement indicator signal in response to the magnitude of the first signal crossing the threshold value;
    sample and hold circuitry coupled to the comparator circuitry and configured to sample and hold a magnitude of a second signal in response to the measurement indicator signal;
    difference calculation circuitry coupled to the sample and hold circuitry and configured to:
        calculate a difference between subsequent measurements of the magnitude of the second signal; and
        provide a difference signal based on the difference; and
    delay control circuitry coupled to the difference calculation circuitry and the programmable delay circuitry and configured to:
        calculate a delay between the first signal and the second signal based on changes in the difference signal over time; and
        provide the delay control signal based on the delay.

2. The delay estimation circuitry of claim 1 wherein the first signal and the second signal are monotonically related.

3. The delay estimation circuitry of claim 2 wherein:
    the first signal is one of a target envelope power supply voltage for a radio frequency power amplifier and an envelope power supply voltage for the radio frequency power amplifier; and
    the second signal is an estimated envelope power supply current for the radio frequency power amplifier.

4. The delay estimation circuitry of claim 2 wherein:
    the first signal is one of a target envelope power supply voltage for a radio frequency power amplifier and an envelope power supply voltage for the radio frequency power amplifier; and
    the second signal is an output power of the radio frequency power amplifier.

5. The delay estimation circuitry of claim 1 wherein the delay control circuitry is further configured to generate a delay compensation control signal based on the delay between the first signal and the second signal.

6. The delay estimation circuitry of claim 1 further comprising:
    additional programmable delay circuitry configured to delay the second signal by an amount determined by an additional delay control signal;
    additional comparator circuitry coupled to the additional programmable delay circuitry and configured to:
        detect when a magnitude of the second signal from the additional programmable delay circuitry crosses an additional threshold value; and
        provide an additional measurement indicator signal in response to the magnitude of the second signal crossing the additional threshold value;
    additional sample and hold circuitry coupled to the additional comparator circuitry and configured to sample and hold a magnitude of the first signal in response to the additional measurement indicator signal;
    additional difference calculation circuitry configured to:
        calculate a difference between subsequent measurements of the magnitude of the first signal; and
        provide an additional difference signal based on the difference; and
    wherein the delay control circuitry is further coupled to the additional difference calculation circuitry and the additional programmable delay circuitry and further configured to:
        calculate the delay between the first signal and the second signal based on changes in the difference signal and the additional difference signal over time; and
        provide the additional delay control signal based on the delay.

7. The delay estimation circuitry of claim 6 further comprising signal estimator circuitry configured to generate the second signal based on the first signal.

8. The delay estimation circuitry of claim 6 wherein the delay control circuitry is further configured to generate a delay compensation control signal based on the delay between the first signal and the second signal.

9. The delay estimation circuitry of claim 1 further comprising signal estimator circuitry configured to generate the second signal based on the first signal.

10. Envelope power supply circuitry comprising:
envelope tracking power supply circuitry configured to provide an envelope power supply voltage based on a power envelope of a radio frequency input signal for a radio frequency power amplifier such that a delay between the envelope power supply voltage and the radio frequency input signal is based on a delay compensation control signal; and
delay estimation circuitry comprising:
programmable delay circuitry configured to delay a first signal by an amount determined by a delay control signal;
comparator circuitry coupled to the programmable delay circuitry and configured to:
detect when a magnitude of the first signal from the programmable delay circuitry crosses a threshold value; and
provide a measurement indicator signal in response to the magnitude of the first signal crossing the threshold value;
sample and hold circuitry coupled to the comparator circuitry and configured to sample and hold a magnitude of a second signal in response to the measurement indicator signal;
difference calculation circuitry configured to:
calculate a difference between subsequent measurements of the magnitude of the second signal; and
provide a difference signal based on the difference; and
delay control circuitry coupled to the difference calculation circuitry and configured to:
calculate a delay between the first signal and the second signal based on changes in the difference signal over time;
provide the delay compensation control signal based on the delay between the first signal and the second signal; and
provide the delay control signal based on the changes in the difference signal over time.

11. The envelope power supply circuitry of claim 10 wherein:
the first signal is one of a target envelope power supply voltage for the radio frequency power amplifier and the envelope power supply voltage for the radio frequency power amplifier; and
the second signal is an estimated envelope power supply current for the radio frequency power amplifier.

12. The envelope power supply circuitry of claim 10 wherein:
the first signal is one of a target envelope power supply voltage for the radio frequency power amplifier and the envelope power supply voltage for the radio frequency power amplifier; and
the second signal is an output power of the radio frequency power amplifier.

13. The envelope power supply circuitry of claim 10 wherein the delay estimation circuitry further comprises:
additional programmable delay circuitry configured to delay the second signal by an amount determined by an additional delay control signal;
additional comparator circuitry coupled to the additional programmable delay circuitry and configured to:
detect when a magnitude of the second signal from the additional programmable delay circuitry crosses an additional threshold value; and
provide an additional measurement indicator signal in response to the magnitude of the second signal crossing the additional threshold value;
additional sample and hold circuitry coupled to the additional comparator circuitry and configured to sample and hold a magnitude of the first signal in response to the additional measurement indicator signal;
additional difference calculation circuitry configured to:
calculate a difference between subsequent measurements of the magnitude of the first signal; and
provide an additional difference signal based on the difference; and
wherein the delay control circuitry is further coupled to the additional difference calculation circuitry and further configured to:
calculate the delay between the first signal and the second signal based on changes in the difference signal and the additional difference signal over time; and
provide the additional delay control signal based on changes in the additional difference signal over time.

14. The envelope power supply circuitry of claim 13 wherein the delay estimation circuitry further comprises signal estimator circuitry configured to generate the second signal based on the first signal.

15. The envelope power supply circuitry of claim 10 wherein the delay estimation circuitry further comprises signal estimator circuitry configured to generate the second signal based on the first signal.

16. A method comprising:
measuring a magnitude of a second signal each time a first signal crosses a threshold value;
determining a difference between subsequent measurements of the magnitude of the second signal;
estimating a delay between the first signal and the second signal based on the difference between subsequent measurements of the second signal; and
generating an envelope tracking power supply signal based on the estimated delay between the first signal and the second signal.

17. The method of claim 16 wherein the first signal and the second signal are monotonically related.

18. The method of claim 17 wherein:
the first signal is one of a target envelope power supply voltage for a radio frequency power amplifier and an envelope power supply voltage for the radio frequency power amplifier; and
the second signal is an estimated envelope power supply current for the radio frequency power amplifier.

19. The method of claim 17 wherein:
the first signal is one of a target envelope power supply voltage for a radio frequency power amplifier and an envelope power supply voltage for the radio frequency power amplifier; and
the second signal is an output power of the radio frequency power amplifier.

20. The method of claim 16 further comprising adjusting a delay of an envelope power supply signal provided to a radio frequency power amplifier based on the delay compensation control signal.

* * * * *